US012575340B2

(12) United States Patent
Chang et al.

(10) Patent No.: US 12,575,340 B2
(45) Date of Patent: Mar. 10, 2026

(54) RESISTIVE SWITCHING DEVICE AND FABRICATION METHOD THEREOF

(71) Applicant: UNITED MICROELECTRONICS CORP., Hsin-Chu City (TW)

(72) Inventors: Kai-Jiun Chang, Taoyuan City (TW); Yu-Huan Yeh, Taichung City (TW); Chuan-Fu Wang, Miaoli County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 389 days.

(21) Appl. No.: 18/237,915

(22) Filed: Aug. 25, 2023

(65) Prior Publication Data

US 2025/0048944 A1 Feb. 6, 2025

(30) Foreign Application Priority Data

Aug. 1, 2023 (TW) ................................. 112128750

(51) Int. Cl.
*H10N 70/00* (2023.01)
*H10B 63/00* (2023.01)
*H10N 70/20* (2023.01)

(52) U.S. Cl.
CPC ......... *H10N 70/8418* (2023.02); *H10B 63/80* (2023.02); *H10N 70/011* (2023.02); *H10N 70/24* (2023.02); *H10N 70/8265* (2023.02); *H10N 70/8833* (2023.02)

(58) Field of Classification Search
CPC .. H10N 70/8418; H10N 70/011; H10N 70/24; H10N 70/8265; H10N 70/8833; H10N 70/826; H10N 70/20; H10N 70/841; H10B 63/80; H10B 63/30; H10B 63/00
USPC ............................................. 257/4
See application file for complete search history.

(56) References Cited

U.S. PATENT DOCUMENTS

2024/0164224 A1* 5/2024 Chang ................... H10N 70/24

* cited by examiner

*Primary Examiner* — Tong-Ho Kim
(74) *Attorney, Agent, or Firm* — Winston Hsu

(57) ABSTRACT

A resistive switching device includes a substrate, a first dielectric layer on the substrate, a conductive via in the first dielectric layer, and a resistive switching structure embedded in an upper portion of the conductive via. The resistive switching structure includes a top electrode layer having a lower sharp corner, a resistive switching material layer disposed around the lower sharp corner of the top electrode layer, and a bottom electrode layer disposed between the resistive switching material layer and the upper portion of the conductive via.

20 Claims, 14 Drawing Sheets

RESISTIVE SWITCHING DEVICE AND FABRICATION METHOD THEREOF

BACKGROUND OF THE INVENTION

1. Field of the Invention

The invention relates to the field of semiconductor technology, in particular to a resistive switching device and a fabrication method thereof.

2. Description of the Prior Art

Resistive random access memory (RRAM) is a memory structure including an array of RRAM cells each of which stores a bit of data using resistance values, rather than electronic charge. Particularly, each RRAM cell includes a resistive-switching material layer, the resistance of which can be adjusted to represent logic "0" or logic "1."

In advanced technology nodes, the feature size scales down and the size of memory devices is reduced accordingly. However, the reduction of the RRAM devices is limited due to the "forming" operation. In the "forming" process, a high voltage is applied to the RRAM device to generate a conductive path in the resistive-switching material layer.

Since RRAM components are manufactured in the back-end metal process, loading effect may occur between the memory area and the logic circuit area, increasing the risk of copper residue or via open in the transition area between the memory area and the logic circuit area. Further, there is a need for an improved RRAM structure capable of forming a stronger electric field during operation to improve the performance of the "forming" process.

SUMMARY OF THE INVENTION

It is one objective of the present invention to provide an improved resistive switching device and its manufacturing method to solve the deficiencies or shortcomings of the prior art.

One aspect of the invention provides a resistive switching device including a substrate; a first dielectric layer on the substrate; a conductive via in the first dielectric layer; and a resistive switching structure embedded in an upper portion of the conductive via. The resistive switching structure includes a top electrode layer having a lower sharp corner, a resistive switching material layer wrapping around the lower sharp corner of the top electrode layer, and a bottom electrode layer disposed between the resistive switching material layer and the upper portion of the conductive via.

According to some embodiments, the lower sharp corner is a right-angled corner or an obtuse-angled corner.

According to some embodiments, the resistive switching structure has an L-shaped sectional profile.

According to some embodiments, the resistive switching structure has a zigzag-shaped sectional profile.

According to some embodiments, the resistive switching structure has a top surface that is coplanar with a top surface of the first dielectric layer and a top surface of the conductive via.

According to some embodiments, the resistive switching structure has a sidewall surface that is covered with a spacer.

According to some embodiments, the spacer comprises silicon nitride.

According to some embodiments, the resistive switching device further includes a landing metal structure embedded in the first dielectric layer and engaged with the resistive switching structure. The landing metal structure is in direct contact with the spacer and the top electrode layer, and wherein the landing metal structure has a top surface that is coplanar with a top surface of the first dielectric layer.

According to some embodiments, the conductive via comprises tungsten.

According to some embodiments, the bottom electrode comprises TaN, TiN, Pt, Ir, Ru, or W.

According to some embodiments, the top electrode comprises TiN, TaN, Pt, Ir, or W.

According to some embodiments, the resistive switching layer comprises hafnium oxide, tantalum oxide, or titanium.

According to some embodiments, the resistive switching device further includes a second dielectric layer on the top electrode layer; and a contact penetrating through the second dielectric layer and being electrically connected with the top electrode layer.

Another aspect of the invention provides a method for forming a resistive switching device. A substrate is provided. A first dielectric layer is formed on the substrate. A conductive via is formed in the first dielectric layer. A resistive switching structure embedded in an upper portion of the conductive via is formed. The resistive switching structure includes a top electrode layer having a lower sharp corner, a resistive switching material layer wrapping around the lower sharp corner of the top electrode layer, and a bottom electrode layer disposed between the resistive switching material layer and the upper portion of the conductive via.

According to some embodiments, the lower sharp corner is a right-angled corner or an obtuse-angled corner.

According to some embodiments, the resistive switching structure has an L-shaped sectional profile.

According to some embodiments, the resistive switching structure has a zigzag-shaped sectional profile.

According to some embodiments, the resistive switching structure has a top surface that is coplanar with a top surface of the first dielectric layer and a top surface of the conductive via.

According to some embodiments, the resistive switching structure has a sidewall surface that is covered with a spacer.

According to some embodiments, the method further includes the step of forming a landing metal structure embedded in the first dielectric layer and engaged with the resistive switching structure. The landing metal structure is in direct contact with the spacer and the top electrode layer, and wherein the landing metal structure has a top surface that is coplanar with a top surface of the first dielectric layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
FIG. 1 to FIG. 13 are schematic diagrams showing a method for forming a resistive switching device according to an embodiment of the present invention.
Figure 1:
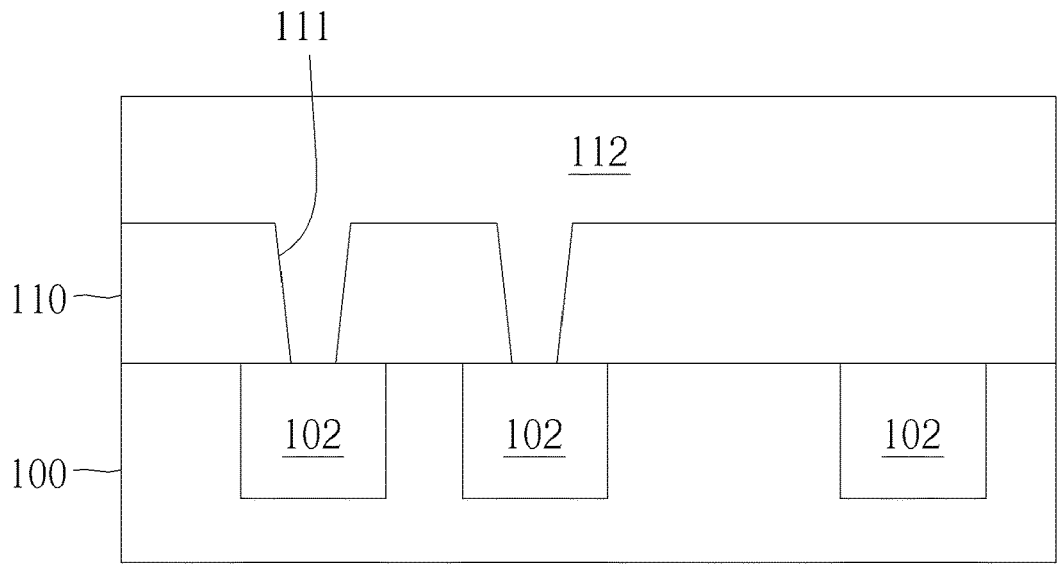

Please refer to FIG. 1 to FIG. 13, which are schematic diagrams showing a method for forming a resistive switching device according to an embodiment of the present invention. As shown in FIG. 1, a substrate 100, such as a silicon substrate, is provided. According to an embodiment of the present invention, the substrate 100 has a memory region MR and a logic circuit region LR. At least one conductive structure 102 is formed on the substrate 100 in the memory region MR. The at least one conductive structure 102 includes, but not limited to, a metal layer or a metal pad. According to an embodiment of the present invention, for example, the conductive structure 102 may be a damascene copper structure. Those skilled in the art should understand that the substrate 100 may further include circuit elements, dielectric layers, and interconnect structures, etc., which are not shown in the figure for the sake of simplicity.

Subsequently, a first dielectric layer 110 is formed on the substrate 100 to cover the conductive structure 102. According to an embodiment of the present invention, for example, the first dielectric layer 110 may comprise a dielectric material such as silicon oxide. A via hole 111 is then formed in the first dielectric layer 110 within the memory region MR by using lithography and etching processes to expose part of the conductive structure 102. Next, a metal layer 112, such as a tungsten metal layer, is deposited on the substrate 100 to fill the via hole 111.

Figure 2:
Figure 2:
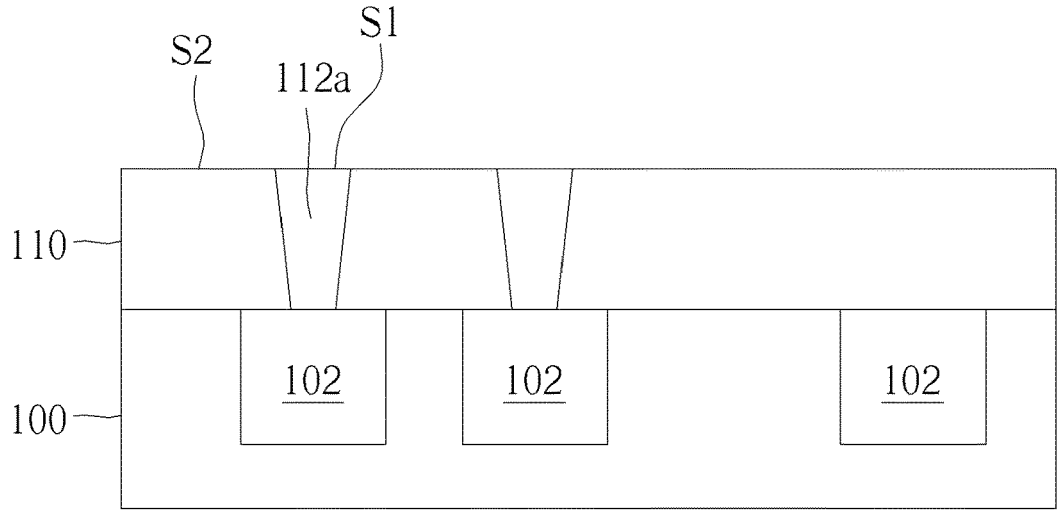

As shown in FIG. 2, a chemical mechanical polishing (CMP) process is then performed to remove the metal layer 112 outside the via hole 111, leaving only the metal layer 112 inside the via hole 111, thereby forming a conductive via 112a. The top surface S1 of the conductive via 112a is coplanar with the top surface S2 of the first dielectric layer 110.

Figure 3:
Figure 3:
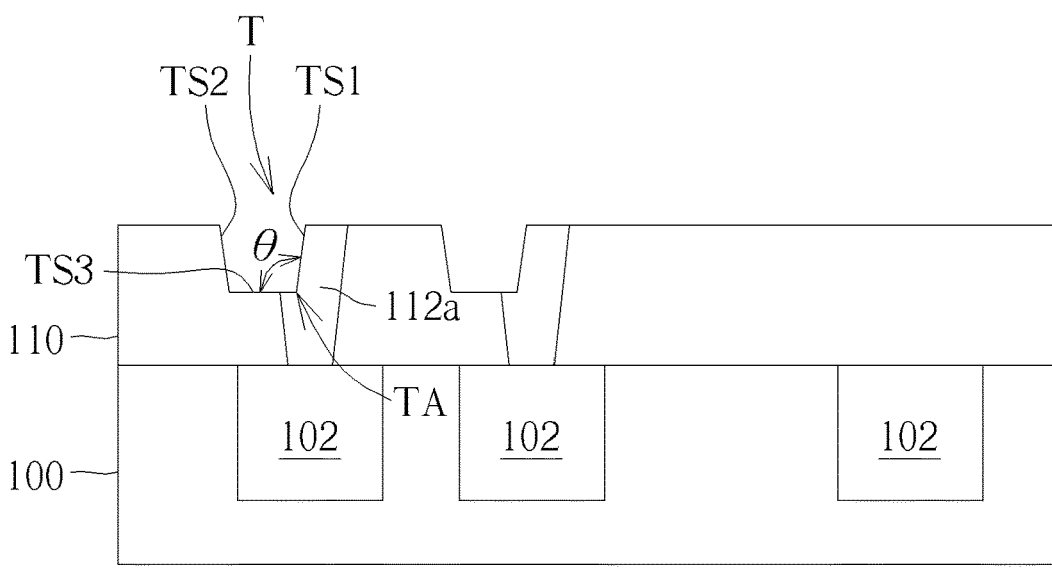

As shown in FIG. 3, a trench T is formed on the upper portion of the conductive via 112a and in the first dielectric layer 110 by using lithography and etching processes. The trench T includes the sidewall TS1 formed by the conductive via 112a, the sidewall TS2 formed by the first dielectric layer 110, and the bottom surface TS3 formed by the conductive via 112a and the first dielectric layer 110. A lower sharp corner TA, for example, a right-angled corner or an obtuse-angled corner, is formed between the sidewall TS1 and the bottom surface TS3. According to an embodiment of the present invention, the angle $\Theta$ between the sidewall TS1 and the bottom surface TS3 may be a right angle or an obtuse angle. According to an embodiment of the present invention, the bottom surface TS3 may be a flat plane or a slightly concave curved surface.

Figure 4:
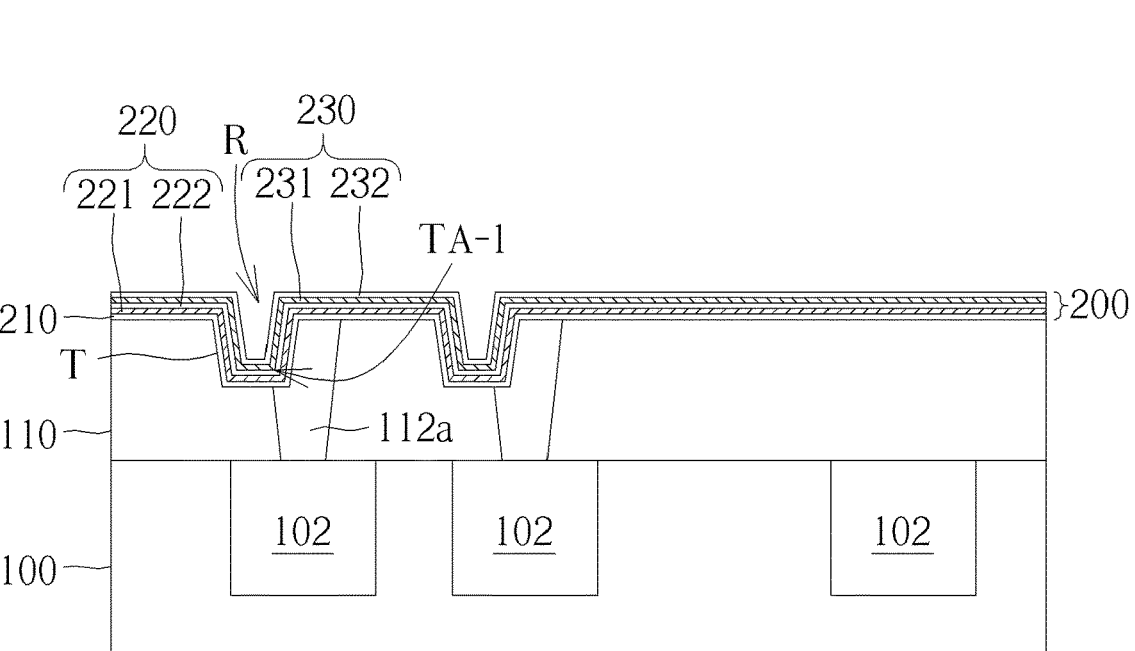

As shown in FIG. 4, a stack structure 200 including a bottom electrode layer 210, a resistive switching layer 220 and a top electrode layer 230 is conformally deposited on the first dielectric layer 110 and in the trench T by using a chemical vapor deposition (CVD) process or an atomic layer deposition (ALD) process. According to an embodiment of the present invention, for example, the top surface of the top electrode layer 230 may form a recessed region R in the trench T. The top electrode layer 230 also has a lower sharp corner TA-1.

According to an embodiment of the present invention, for example, the bottom electrode layer 210 may comprise TaN, TiN, Pt, Ir, Ru, or W. According to an embodiment of the present invention, for example, the resistive switching layer 220 may comprise a tantalum oxide layer 221 and a hafnium oxide layer 222. According to an embodiment of the present invention, the resistive switching layer 220 may comprise hafnium oxide, tantalum oxide or titanium. According to an embodiment of the present invention, for example, the top electrode layer 230 may comprise Ir layer 231 and TiN layer 232. According to an embodiment of the present invention, for example, the top electrode layer 230 may comprise TiN, TaN, Pt, Ir or W.

Figure 5:
Figure 5:
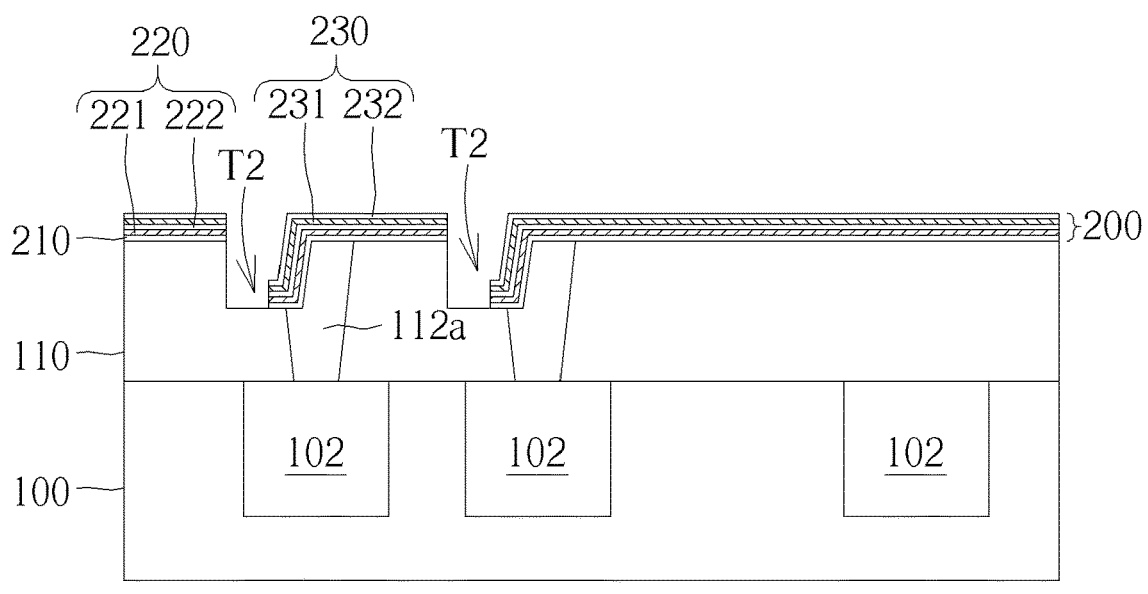

As shown in FIG. 5, a trench T2 is then formed in the stack structure 200 and the first dielectric layer 110 beside the conductive via 112a by using lithography and etching processes. According to an embodiment of the present invention, for example, the depth of the trench T2 is approximately equal to the depth of the trench T. Referring to FIG. According to some embodiments of the present invention, for example, the depth of the trench T2 may be slightly greater than the depth of the trench T. According to an embodiment of the present invention, the stack structure 200 at the bottom of the trench T2 is completely removed.

Figure 6:
Figure 6:
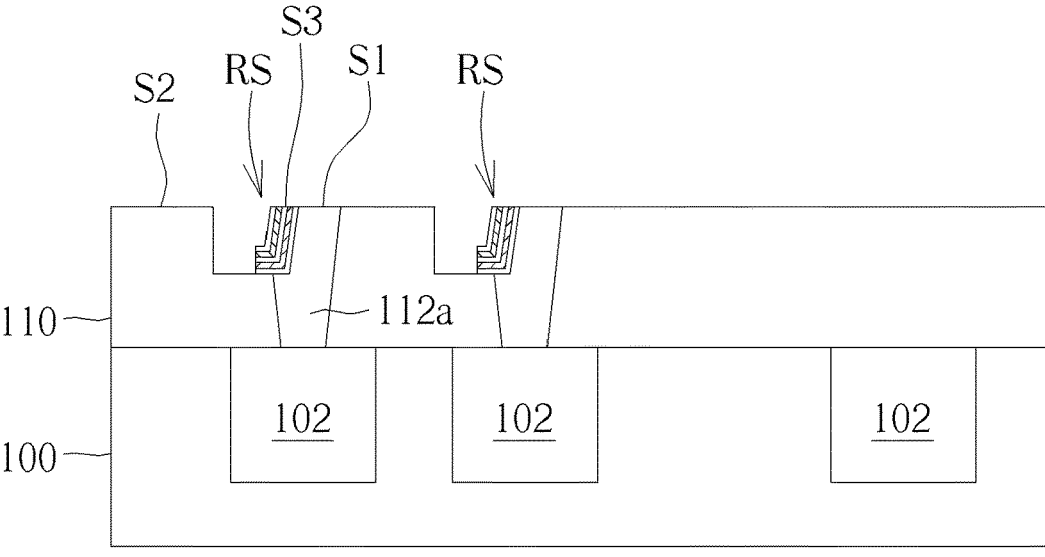

As shown in FIG. 6, a chemical mechanical polishing process is then performed to remove the stack structure 200 outside the trench T2, thereby forming the resistive switching structure RS that is embedded in the upper portion of the conductive via 112a. According to an embodiment of the invention, the resistive switching structure RS has an L-shaped sectional profile. According to an embodiment of the present invention, the top surface S3 of the resistive switching structure RS is coplanar with the top surface S2 of the first dielectric layer 110 and the top surface S1 of the conductive via 112a.

Figure 7:
Figure 7:
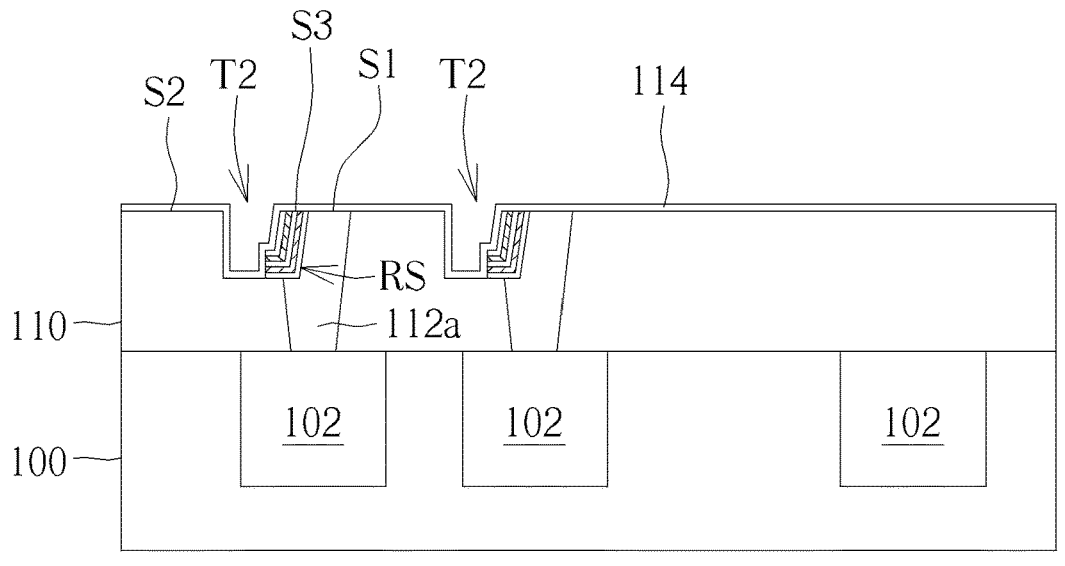

As shown in FIG. 7, an etch stop layer 114 is then deposited on the substrate 100 in a blanket manner. The etch stop layer 114 is conformally deposited on the first dielectric layer 110 and in the trench T2. The etch stop layer 114 covers the resistive switching structure RS. According to an embodiment of the present invention, for example, the etch stop layer 114 may comprise a nitrogen-doped silicon carbide (NDC) layer.

Figure 8:
Figure 8:
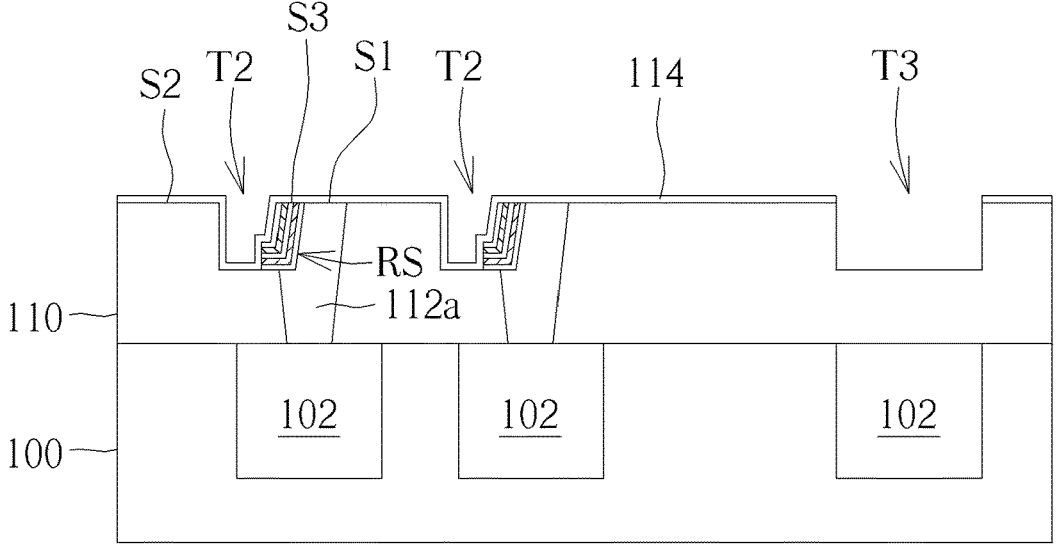

As shown in FIG. 8, a trench T3 is then formed in the etch stop layer 114 and the first dielectric layer 110 within the logic circuit region LR by using lithography and etching processes.

Figure 9:
Figure 9:
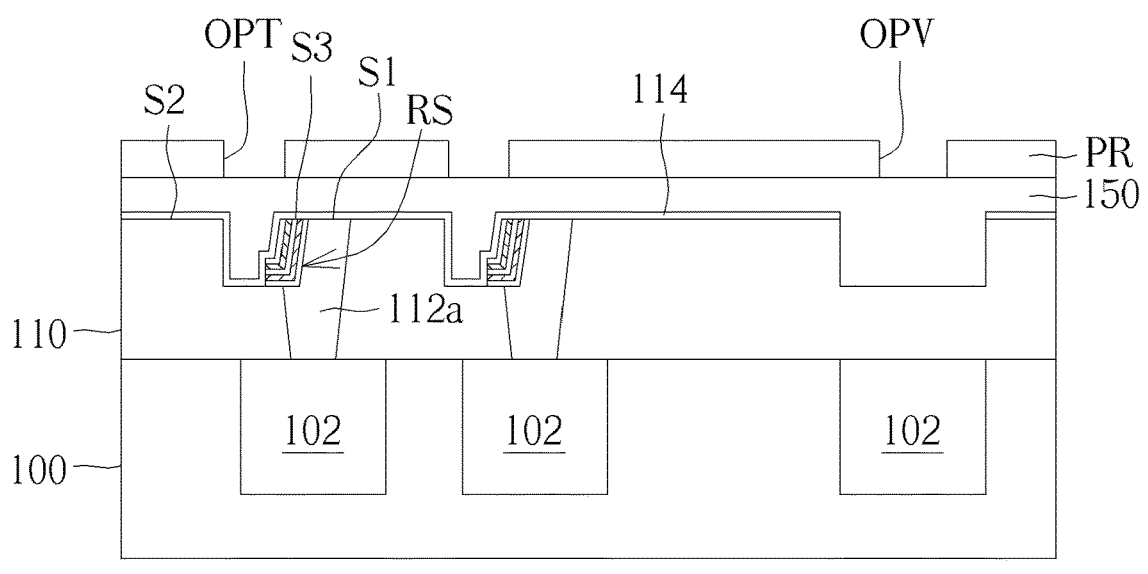

As shown in FIG. 9, a planarization layer 150 is formed on the etch stop layer 114 and in the trench T3. The planarization layer 150 may comprises spin-on-glass, but not limited thereto. A photolithography process is then performed to form a photoresist pattern PR on the planarization layer 150. According to an embodiment of the present invention, the photoresist pattern PR has an opening OPV in the logic circuit region LR, defining the position of the via hole to be formed in the first dielectric layer 110. According to an embodiment of the present invention, the photoresist pattern PR has an opening OPT in the memory region MR, which is located directly above the trench T2 and aligned with the trench T2.

Figure 10:
Figure 10:
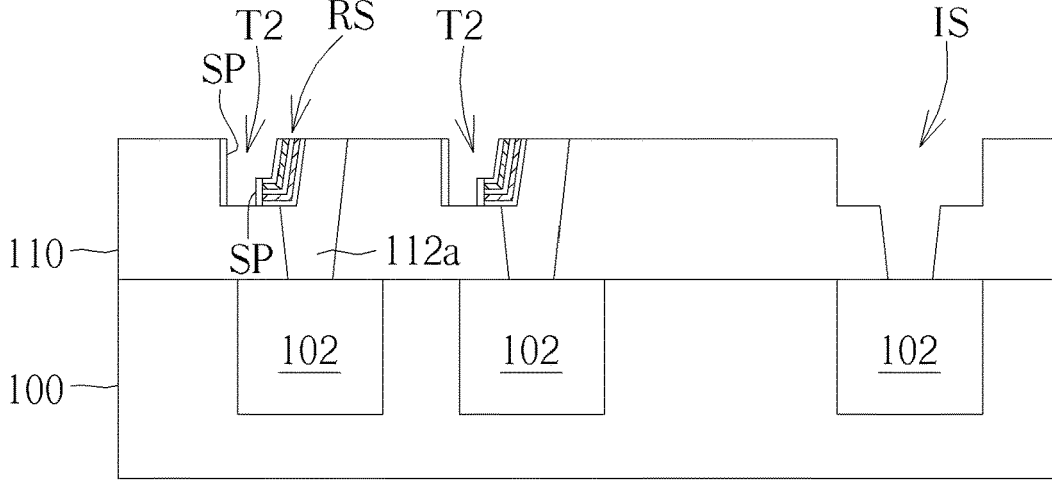

As shown in FIG. 10, using the photoresist pattern PR as an etching resist mask, an anisotropic dry etching process is performed, and the planarization layer 150 and the first dielectric layer 110 are etched through the opening OPV, and the planarization layer 150 and the etch stop layer 114 are etched simultaneously through the opening OPT, so that the circuit trench structure IS is formed in the logic circuit region LR, and the spacer SP is formed on the sidewall of the trench T2 in the memory region MR. According to an embodiment of the present invention, for example, the spacer SP may comprise silicon nitride.

Figure 11:
Figure 11:
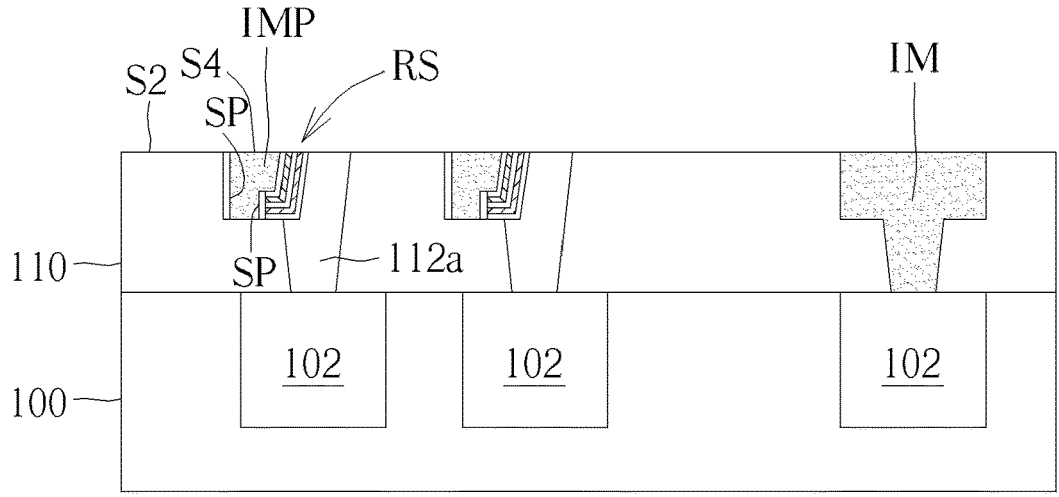

As shown in FIG. 11, the metallization process is then performed, and the metal layers IM and IMP are respectively filled in the circuit trench structure IS of the logic circuit region LR and the trench T2 of the memory region MR. The metal layer IMP and the resistive switching structures RS are separated by the spacer SP. According to an embodiment of the present invention, the metal layer IMP covers the spacer SP on the resistive switching structure RS, and is in direct contact with the top electrode layer 230 of the resistive switching structure RS.

According to an embodiment of the present invention, the metal layer IMP is used as a pad metal structure, which is embedded in the first dielectric layer 110 and correspondingly connected with the resistive switching structure RS. According to an embodiment of the present invention, the metal layer IMP is in direct contact with the spacer SP and the top electrode layer 230. The top surface S4 of the metal layer IMP is coplanar with the top surface S2 of the first dielectric layer 110.

Figure 12:
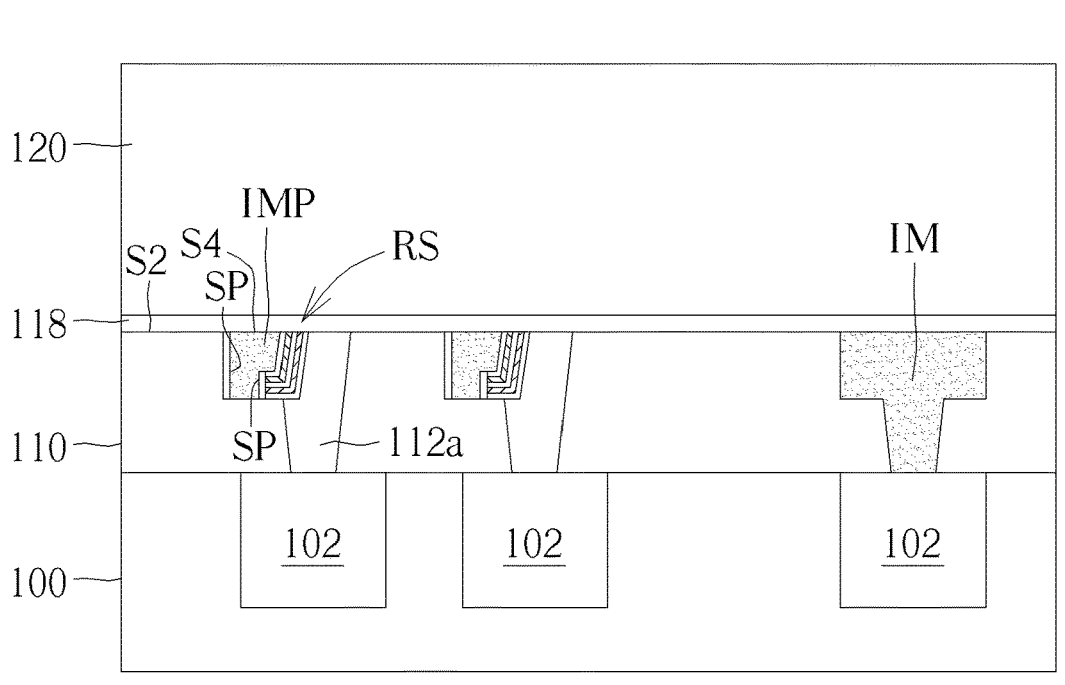

As shown in FIG. 12, a chemical vapor deposition process is then performed to deposit an etch stop layer 118 and a second dielectric layer 120 on the substrate 100 in a blanket manner. According to an embodiment of the present invention, for example, the etch stop layer 118 may comprise a silicon nitride layer or a nitrogen-doped silicon carbide layer, but is not limited thereto. According to an embodiment of the present invention, for example, the second dielectric layer 120 may comprise a silicon oxide layer, but is not limited thereto.

Figure 13:
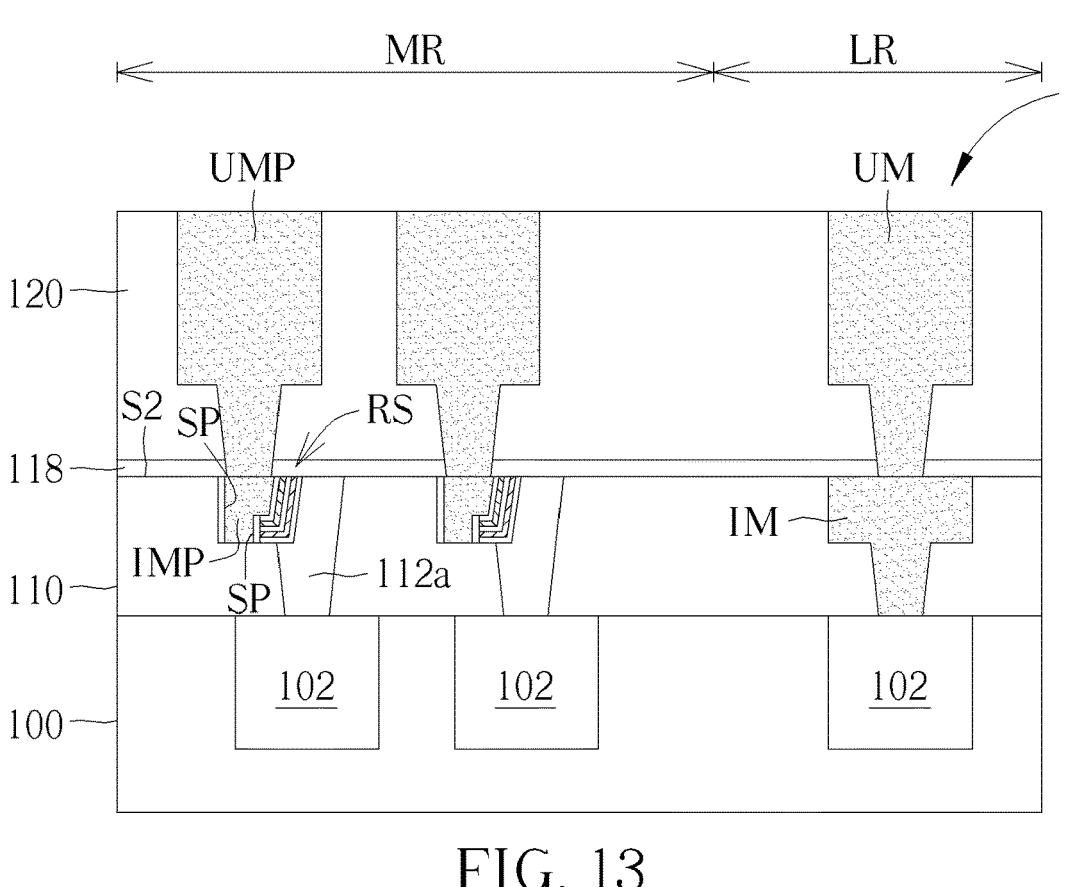

As shown in FIG. 13, a metallization process is performed to form contact structures UM and UMP in the second dielectric layer 120 and the etch stop layer 118 in the logic circuit region LR and the memory region MR respectively. The contact structure UMP formed in the memory region MR directly contacts the metal layer IMP. The contact structure UMP penetrates the second dielectric layer 120 and is electrically connected to the top electrode layer 230 of the resistive switching structure RS.

Structurally, as shown in FIG. 13, the resistive switching device 1 of the present invention includes a substrate 100, a first dielectric layer 110 disposed on the substrate 100, and a conductive via 112a disposed in the first dielectric layer 110. The resistive switching device 1 further includes a resistive switching structure RS embedded in the upper portion of the conductive via 112a. The resistive switching structure RS comprises a top electrode layer 230 having a lower sharp corner TA-1, a resistive switching material layer 220 wrapping around the lower sharp corner TA-1 of the top electrode layer 230, and a bottom electrode layer 220 disposed between the resistive switching material layer 220 and the upper portion of the conductive via 112a.

Please refer to FIG. 14 to FIG. 20, which are schematic diagrams of a method for forming a resistive switching device according to another embodiment of the present invention, wherein like regions, layers or elements are designated by like numeral numbers or labels.

Figure 14:
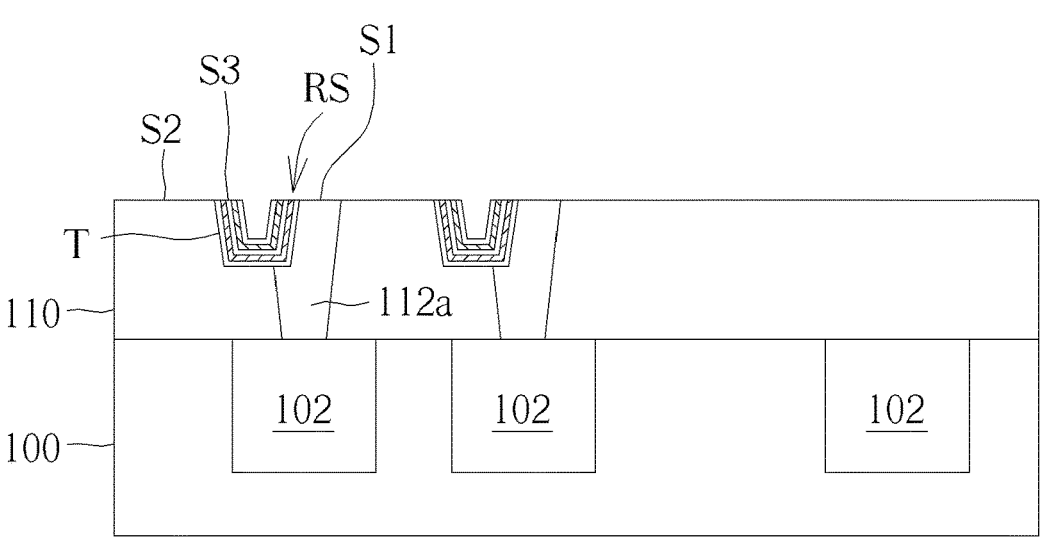
FIG. 14 to FIG. 20 are schematic diagrams showing a method for forming a resistive switching device according to another embodiment of the present invention.

After the steps depicted in FIG. 1 to FIG. 4 are completed, as shown in FIG. 14, a chemical mechanical polishing process is then performed to remove the stack structure 200 outside the trench T2, thereby forming a resistive switching structure RS partly embedded in the upper portion of the conductive via 112a. According to an embodiment of the present invention, the resistive switching structure RS may have a U-shaped sectional profile. According to an embodiment of the present invention, the top surface S3 of the resistive switching structure RS is coplanar with the top surface S2 of the first dielectric layer 110 and the top surface S1 of the conductive via 112a.

Figure 15:
Figure 15:
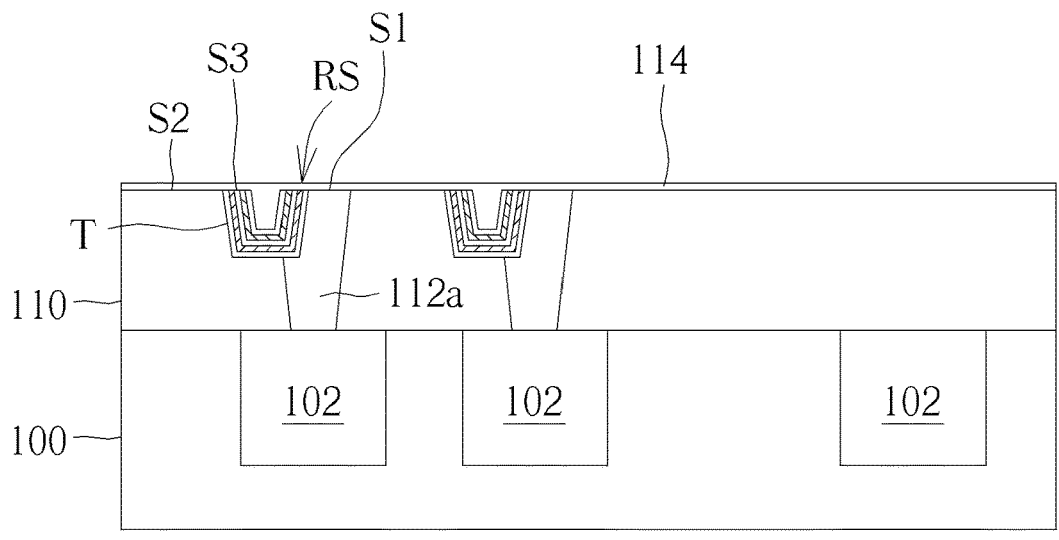

As shown in FIG. 15, an etch stop layer 114 is deposited on the substrate 100 in a blanket manner. The etch stop layer 114 is conformally deposited on the first dielectric layer 110 and on the resistive switching structure RS. According to an embodiment of the present invention, for example, the etch stop layer 114 may comprise a nitrogen-doped silicon carbide layer.

Figure 16:
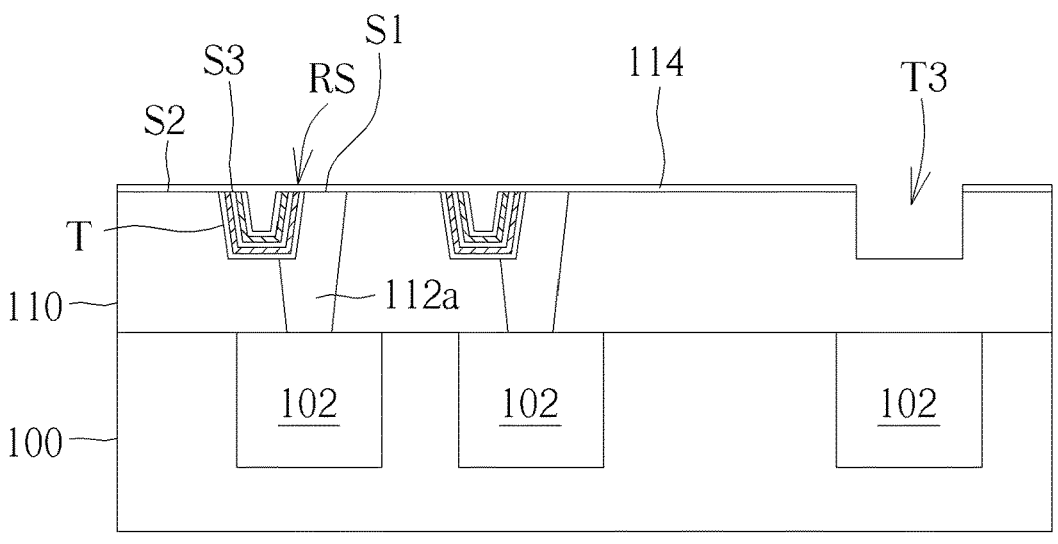

As shown in FIG. 16, a trench T3 is formed in the etch stop layer 114 and the first dielectric layer 110 within the logic circuit region LR by using lithography and etching processes.

Figure 17:
Figure 17:
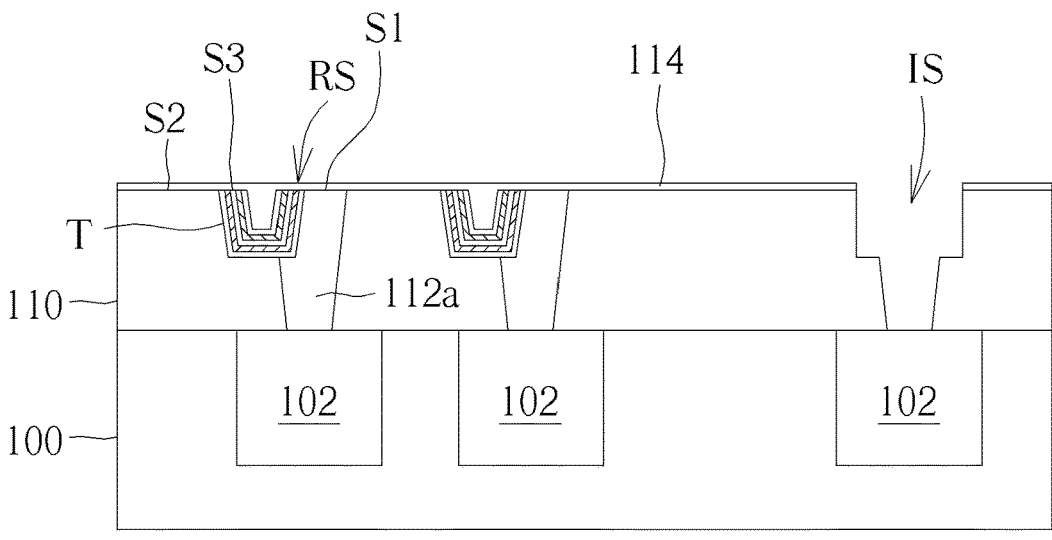

As shown in FIG. 17, lithography and etching processes are then performed to form the circuit trench structure IS within the logic circuit region LR.

Figure 18:
Figure 18:
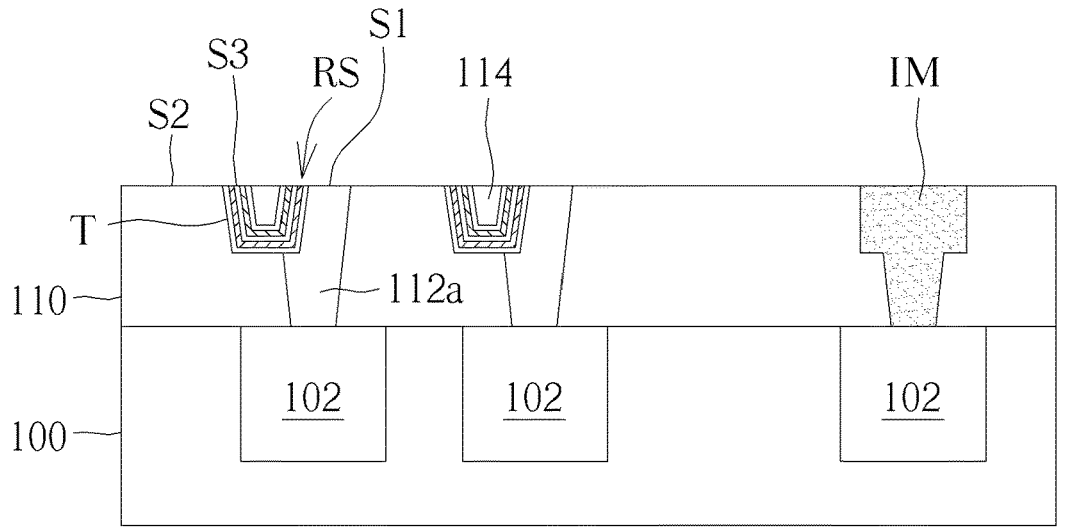

As shown in FIG. 18, a metallization process and a chemical mechanical polishing process are then performed to form a metal layer IM within the circuit trench structure IS of the logic circuit region LR.

Figure 19:
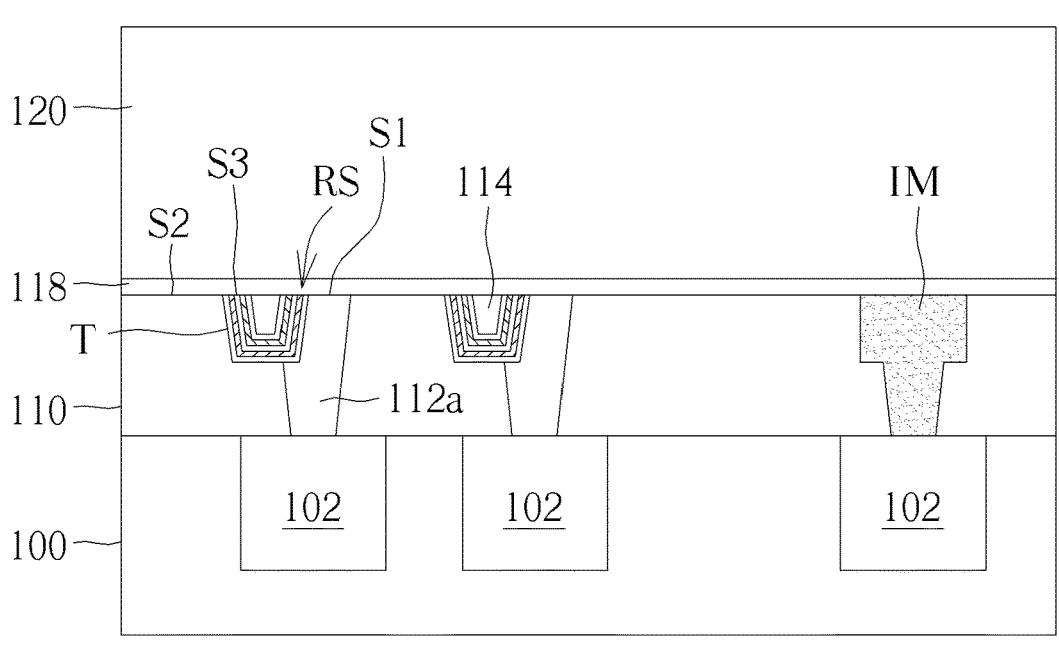
Figure 20:
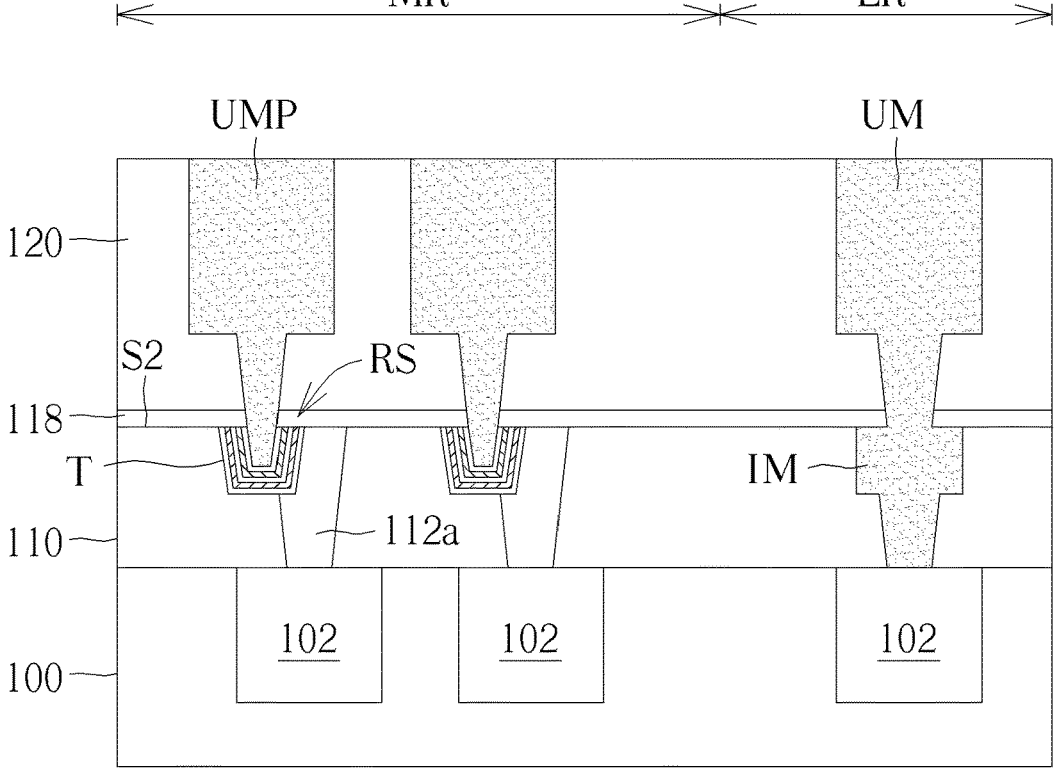

As shown in FIG. 19 and FIG. 20, a chemical vapor deposition process is performed to deposit an etch stop layer 118 and a second dielectric layer 120 on the substrate 100 in a blanket manner. According to an embodiment of the present invention, for example, the etch stop layer 118 may comprise a silicon nitride layer or a nitrogen-doped silicon carbide layer, but is not limited thereto. According to an embodiment of the present invention, for example, the second dielectric layer 120 may comprise a silicon oxide layer, but is not limited thereto.

A metallization process is then performed to form contact structures UM and UMP in the second dielectric layer 120 and the etch stop layer 118 within the logic circuit region LR and the memory region MR respectively. The contact structure UMP formed in the memory region MR penetrates through the etch stop layer 114 and contacts the top electrode layer 230 of the resistive switching structure RS.

Please refer to FIG. 21 to FIG. 27, which are schematic diagrams of a method for forming a resistance switching device according to yet another embodiment of the present invention, wherein like regions, layers or elements are designated by like numeral numbers or labels.

Figure 21:
FIG. 21 to FIG. 27 are schematic diagrams showing a method for forming a resistance switching device according to yet another embodiment of the present invention.
Figure 21:
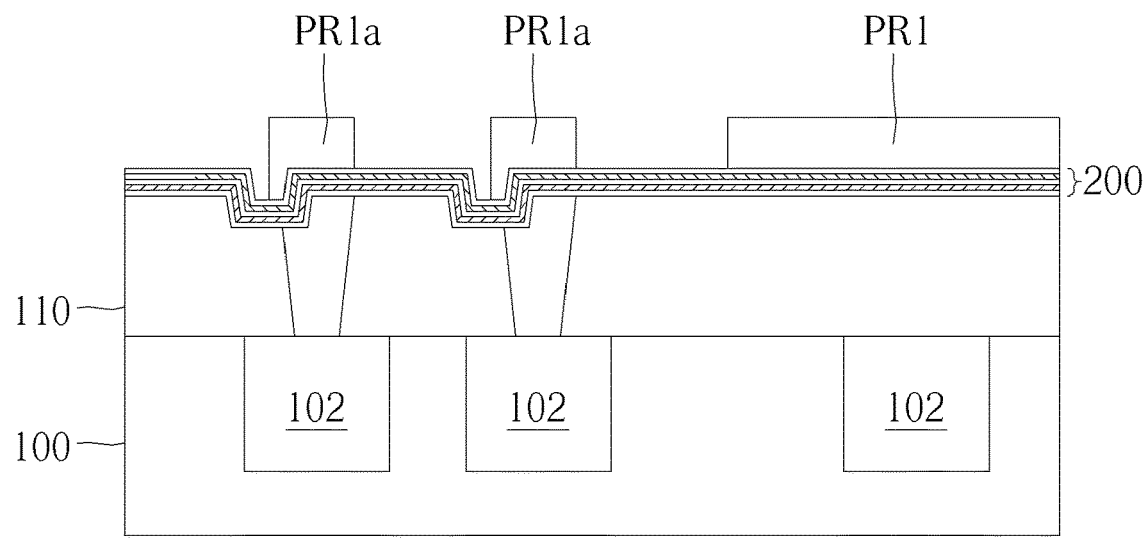

Likewise, after the steps depicted in FIG. 1 to FIG. 4 are completed, as shown in FIG. 21, a photoresist pattern PR1 is formed on the stack structure 200. The photoresist pattern PR1 covers the logic circuit region LR. In the memory region MR, the photoresist pattern PR1 comprises a plurality of island-shaped patterns PR1a aligned with the conductive vias 112a, respectively.

Figure 22:
Figure 22:
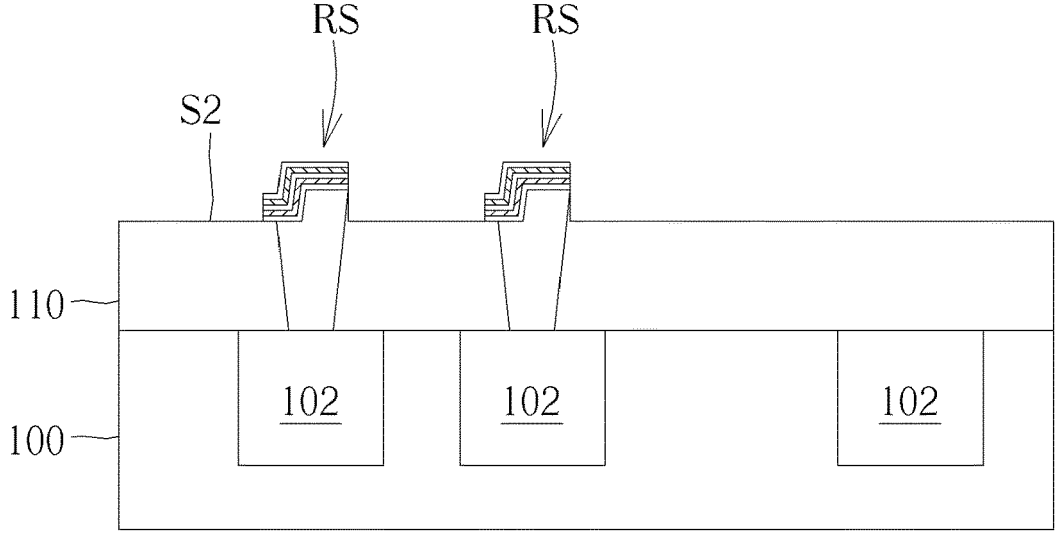

As shown in FIG. 22, an anisotropic dry etching process is performed to etch the stack structure 200 not covered by the photoresist pattern PR1 and part of the first dielectric layer 110, so that resistive switching structure RS having a zigzag sectional profile is formed on the conductive via 112a. At this point, the upper portion of the conductive via 112a and the resistive switching structure RS protrude from the upper surface S2 of the first dielectric layer 110.

Figure 23:
Figure 23:
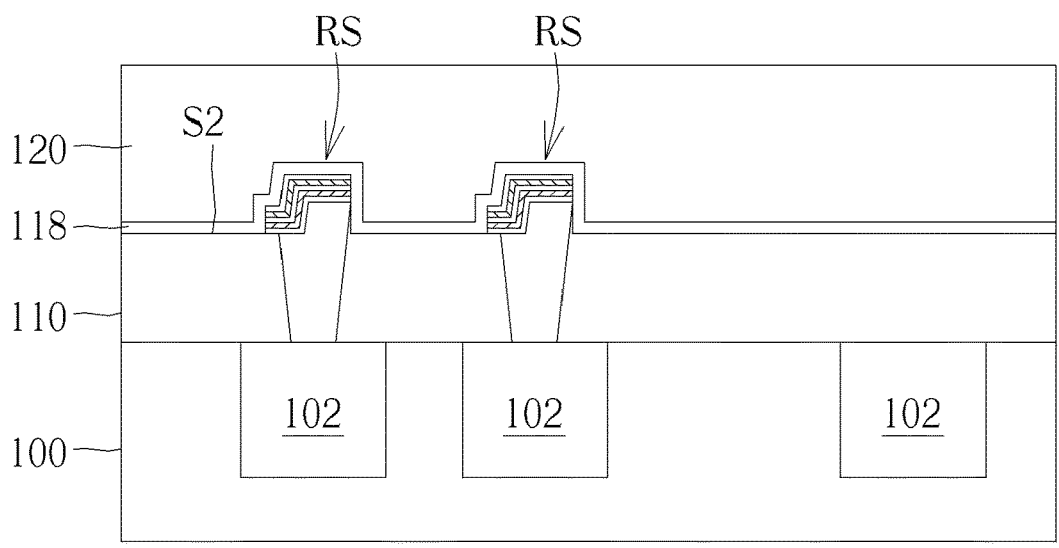

As shown in FIG. 23, an etch stop layer 118 is deposited on the substrate 100 in a blanket manner. The etch stop layer 118 is conformally deposited on the first dielectric layer 110 and on the resistive switching structure RS. According to an embodiment of the present invention, for example, the etch stop layer 118 may comprise a nitrogen-doped silicon carbide layer. A second dielectric layer 120 is then deposited on the etch stop layer 118. According to an embodiment of the present invention, for example, the second dielectric layer 120 may comprise a silicon oxide layer, but is not limited thereto.

Figure 24:
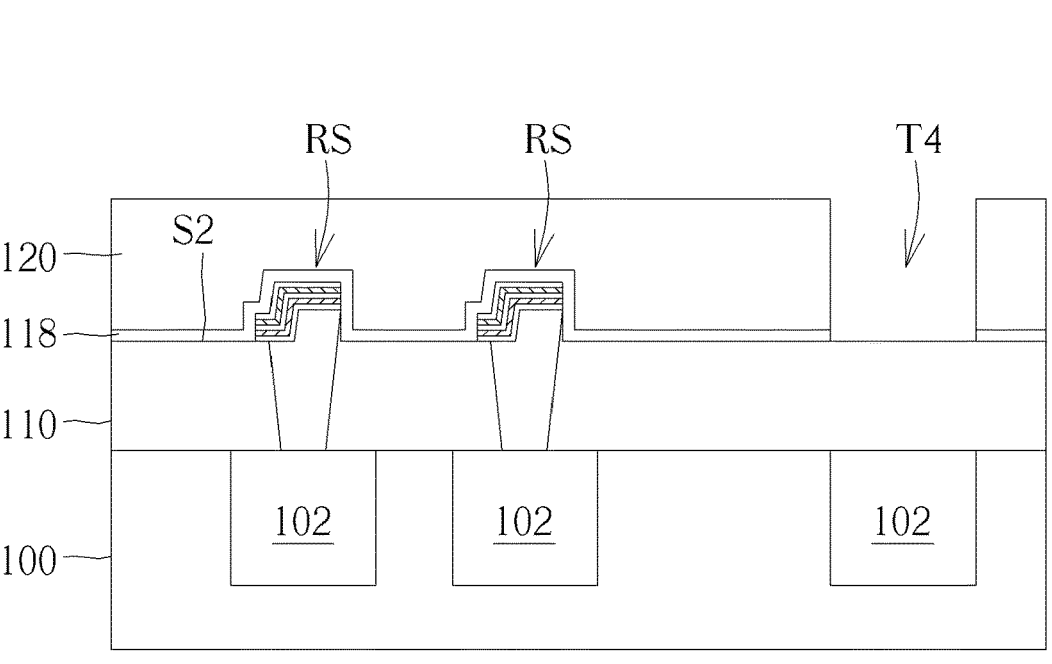

As shown in FIG. 24, a trench T4 is formed in the etch stop layer 118 and the second dielectric layer 120 within the logic circuit region LR by using lithography and etching processes.

Figure 25:
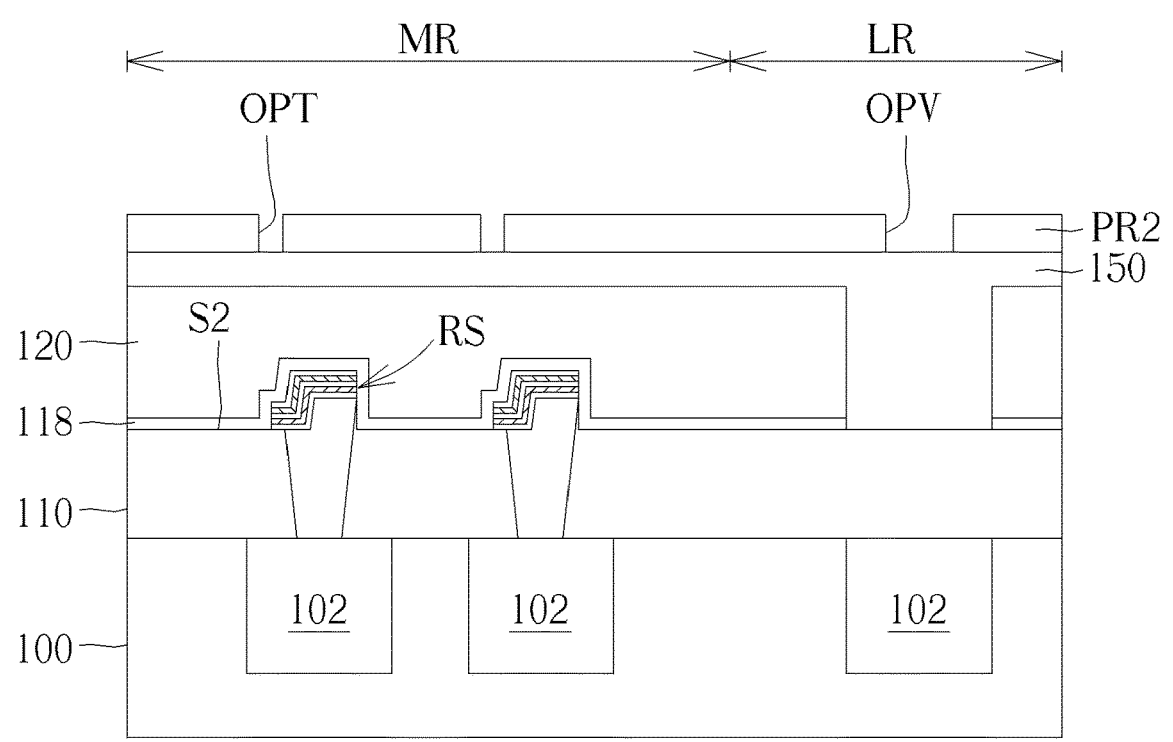

As shown in FIG. 25, a planarization layer 150 is then formed on the second dielectric layer 120 and in the trench T4. The planarization layer 150 may comprise spin-on-glass, but not limited thereto. A photolithography process is performed to form a photoresist pattern PR2 on the planarization layer 150. According to an embodiment of the present invention, the photoresist pattern PR2 has an opening OPV within the logic circuit region LR, defining the position of the via hole to be formed in the first dielectric layer 110. According to an embodiment of the present invention, the photoresist pattern PR2 has an opening OPT within the memory region MR, which is located directly above the conductive via 112*a* and aligned with the conductive via 112*a*.

Figure 26:
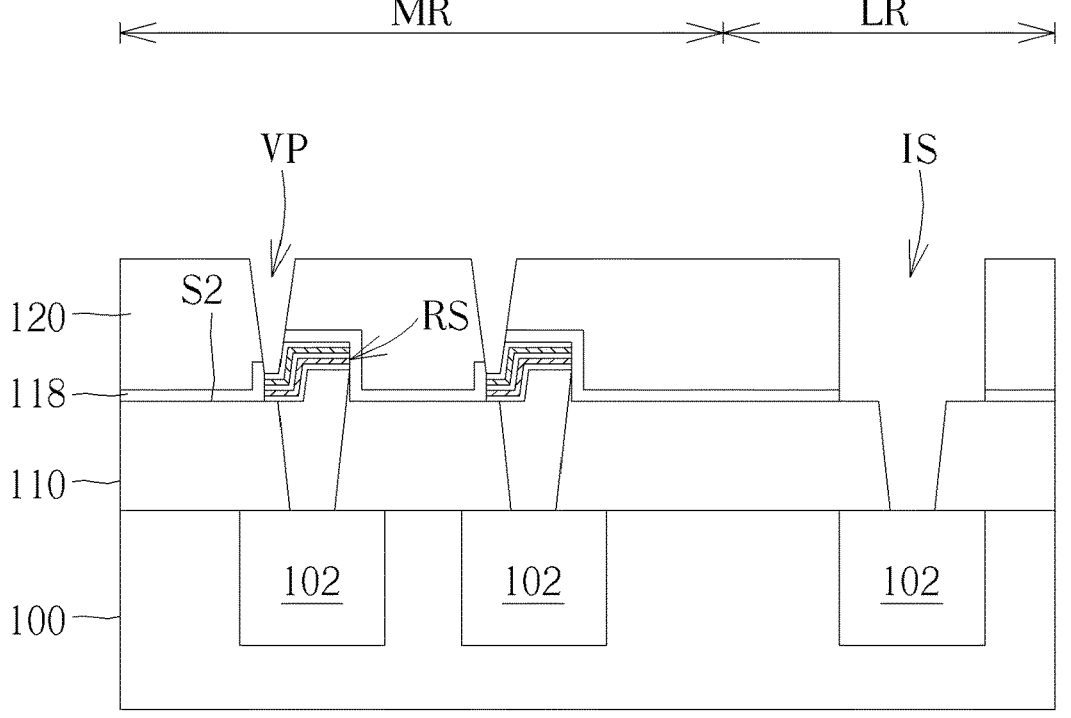

As shown in FIG. 26, using the photoresist pattern PR2 as an etching resist mask, an anisotropic dry etching process is performed to etch the planarization layer 150 and the first dielectric layer 110 through the opening OPV, and etch the planarization layer 150 and the etch stop layer 114 simultaneously through the opening OPT, so that a circuit trench structure IS is formed within the logic circuit region LR, and a via hole VP exposing a part the top electrode layer 230 is formed in the second dielectric layer 120 within the memory region MR.

Figure 27:
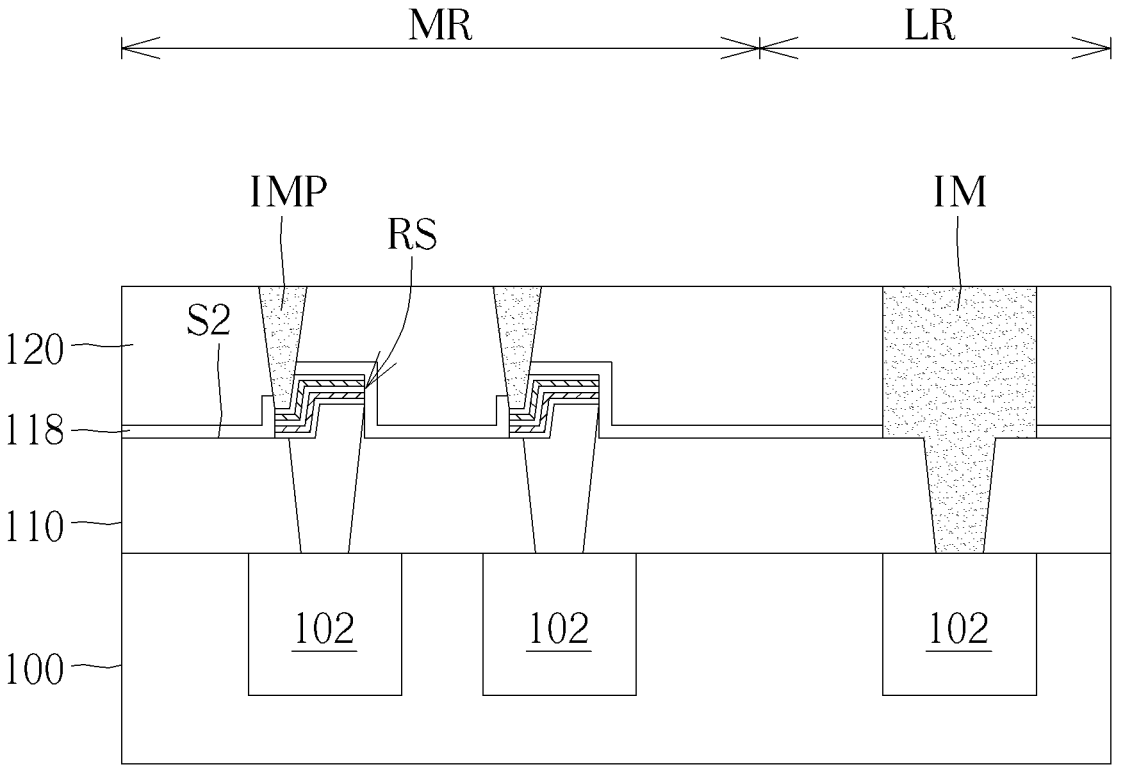

As shown in FIG. 27, a metallization process is then performed to fill the metal layers IM and IMP in the circuit trench structure IS within the logic circuit region LR and the via hole VP within the memory region MR, respectively. According to an embodiment of the invention, the metal layer IMP is in direct contact with the top electrode layer 230 of the resistive switching structure RS.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive switching device, comprising:
a substrate;
a first dielectric layer on the substrate;
a conductive via in the first dielectric layer; and
a resistive switching structure embedded in an upper portion of the conductive via, wherein the resistive switching structure comprises a top electrode layer having a lower sharp corner, a resistive switching material layer wrapping around the lower sharp corner of the top electrode layer, and a bottom electrode layer disposed between the resistive switching material layer and the upper portion of the conductive via.

2. The resistive switching device according to claim 1, wherein the lower sharp corner is a right-angled corner or an obtuse-angled corner.

3. The resistive switching device according to claim 1, wherein the resistive switching structure has an L-shaped sectional profile.

4. The resistive switching device according to claim 1, wherein the resistive switching structure has a zigzag-shaped sectional profile.

5. The resistive switching device according to claim 1, wherein the resistive switching structure has a top surface that is coplanar with a top surface of the first dielectric layer and a top surface of the conductive via.

6. The resistive switching device according to claim 1, wherein the resistive switching structure has a sidewall surface that is covered with a spacer.

7. The resistive switching device according to claim 6, wherein the spacer comprises silicon nitride.

8. The resistive switching device according to claim 6 further comprising:
a landing metal structure embedded in the first dielectric layer and engaged with the resistive switching structure, wherein the landing metal structure is in direct contact with the spacer and the top electrode layer, and wherein the landing metal structure has a top surface that is coplanar with a top surface of the first dielectric layer.

9. The resistive switching device according to claim 1, wherein the conductive via comprises tungsten.

10. The resistive switching device according to claim 1, wherein the bottom electrode comprises TaN, TiN, Pt, Ir, Ru, or W.

11. The resistive switching device according to claim 1, wherein the top electrode comprises TiN, TaN, Pt, Ir, or W.

12. The resistive switching device according to claim 1, wherein the resistive switching layer comprises hafnium oxide, tantalum oxide, or titanium.

13. The resistive switching device according to claim 1 further comprising:
a second dielectric layer on the top electrode layer; and
a contact penetrating through the second dielectric layer and being electrically connected with the top electrode layer.

14. A method for forming a resistive switching device, comprising:
providing a substrate;
forming a first dielectric layer on the substrate;
forming a conductive via in the first dielectric layer; and
forming a resistive switching structure embedded in an upper portion of the conductive via, wherein the resistive switching structure comprises a top electrode layer having a lower sharp corner, a resistive switching material layer wrapping around the lower sharp corner of the top electrode layer, and a bottom electrode layer disposed between the resistive switching material layer and the upper portion of the conductive via.

15. The method according to claim 14, wherein the lower sharp corner is a right-angled corner or an obtuse-angled corner.

16. The method according to claim 14, wherein the resistive switching structure has an L-shaped sectional profile.

17. The method according to claim 14, wherein the resistive switching structure has a zigzag-shaped sectional profile.

18. The method according to claim 14, wherein the resistive switching structure has a top surface that is coplanar with a top surface of the first dielectric layer and a top surface of the conductive via.

19. The method according to claim 14, wherein the resistive switching structure has a sidewall surface that is covered with a spacer.

20. The method according to claim 19 further comprising:

forming a landing metal structure embedded in the first dielectric layer and engaged with the resistive switching structure, wherein the landing metal structure is in direct contact with the spacer and the top electrode layer, and wherein the landing metal structure has a top surface that is coplanar with a top surface of the first dielectric layer.

* * * * *